United States Patent
Curtis et al.

(10) Patent No.: US 11,592,405 B1
(45) Date of Patent: Feb. 28, 2023

(54) RF SIGNATURE DETECTION FOR WAVEGUIDE DEFORMATION

(71) Applicant: National Technology & Engineering Solutions of Sandia, LLC, Albuquerque, NM (US)

(72) Inventors: Shane Keawe Curtis, Albuquerque, NM (US); Chad Hettler, Corrales, NM (US); John Joseph Borchardt, Albuquerque, NM (US); Tyler Cruz LaPointe, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 49 days.

(21) Appl. No.: 17/494,085

(22) Filed: Oct. 5, 2021

Related U.S. Application Data (60) Provisional application No. 63/109,920, filed on Nov. 5, 2020.

(51) Int. Cl.
  *G01R 27/04* (2006.01)
  *G01R 27/32* (2006.01)
  (Continued)

(52) U.S. Cl.
  CPC .............. *G01N 22/00* (2013.01); *G01D 5/48* (2013.01); *G01N 21/3581* (2013.01);
  (Continued)

(58) Field of Classification Search
  CPC .... G01N 22/00; G01N 22/04; G01N 21/3581; G01D 5/48; H02J 7/02; H02J 50/23;
  (Continued)

(56) References Cited

U.S. PATENT DOCUMENTS

| | | | |
|---|---|---|---|
| 2015/0028889 A1* | 1/2015 | Gong | G01K 7/24 324/633 |
| 2019/0025112 A1* | 1/2019 | Ploss | G01F 1/667 |
| 2019/0057887 A1* | 2/2019 | Ballandras | H03H 9/0259 |

OTHER PUBLICATIONS

Ghasr, M. T. et al., "Wideband Microwave Camera for Real-Time 3-D Imaging," IEEE Transactions on Antennas and Propagation (2017) 65(1):258-268.
(Continued)

*Primary Examiner* — Raul J Rios Russo
(74) *Attorney, Agent, or Firm* — Mark A. Dodd (57) ABSTRACT

A radio frequency (RF) based waveguide health monitoring system is disclosed. The system employs an RF transmitter for launching a probe RF waveform into a waveguide. Reflections, etc., from the interior of the waveguide of the probe RF waveform create a signature RF waveform, with a health RF receiver receiving this resultant signature RF waveform. A health processing system analyzes the signature RF waveform, and when it detects a change indicative of a deformation of the waveguide, generates a warning signal. This change may be due to bends, flexes, vibrations (or changes in vibrations), or separations of the waveguide. The system may have low frequency, high frequency, or high frequency imaging modes. The system may employ a high-power probe RF waveform, thereby enabling a wireless charging system with power RF receivers located along the length of the waveguide providing additional functionality.

20 Claims, 6 Drawing Sheets

(51) Int. Cl.
   *G01N 22/00* (2006.01)
   *H02J 7/02* (2016.01)
   *G01D 5/48* (2006.01)
   *H02J 50/23* (2016.01)
   *G01N 22/04* (2006.01)
   *G01N 21/3581* (2014.01)
   *G08B 21/18* (2006.01)
   *G01R 27/28* (2006.01)
   *G01R 27/06* (2006.01)

(52) U.S. Cl.
   CPC ............... *G01N 22/04* (2013.01); *H02J 7/02* (2013.01); *H02J 50/23* (2016.02); *G01R 27/04* (2013.01); *G01R 27/06* (2013.01); *G01R 27/28* (2013.01); *G08B 21/182* (2013.01)

(58) Field of Classification Search
   CPC ...... G08B 21/182; G01R 27/28; G01R 27/04; G01R 27/06
   USPC ... 324/76.11–76.83, 459, 600, 629, 637, 639
   See application file for complete search history.

(56) References Cited

OTHER PUBLICATIONS

Mast, J. et al., "Micropower Impulse Radar Technology and Applications," Lawrence Livermore National Laboratory Apr. 15, 1998, UCRL-ID-130474, 14 pages.

\* cited by examiner

RF SIGNATURE DETECTION FOR WAVEGUIDE DEFORMATION

RELATED APPLICATIONS

This application claims priority to U.S. Provisional Application No. 63/109,920, filed on Nov. 5, 2020, and entitled RF SIGNATURE DETECTION FOR WAVEGUIDE DEFORMATION, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to the use of radio frequency (RF) monitoring to sense when a waveguide or waveguide-like structure deforms.

BACKGROUND

For many applications, the health of a waveguide, or waveguide-like structure, should be monitored. For example, if the waveguide bends, flexes, vibrates (or changes its vibrations), or separates, the operator of the system may need to take corrective action. As a more concrete example, the waveguide may be a metal petroleum transmission pipeline. The operator will need to continuously monitor the health of the pipeline and if it bends, flexes, vibrates (or changes its vibrations), or separates, the operator may need to shutdown pumping operations as quickly as possible.

Waveguides may be monitored for electrical continuity as one way of determining the health of the system. While this approach may detect when the waveguide suffers a complete failure in the form of separation, it does not detect when a waveguide merely bends, flexes, or vibrates (or changes its vibrations), which may be a precursor to a complete failure.

Waveguides may also be monitored for material flow to determine the health of the system. For example, the flow rate may be measured at both ends of a pipeline, with any difference attributed to a leak, if not complete failure, of the pipeline. As with electrical continuity, this method does not detect when a waveguide merely bends, flexes, or vibrates (or changes its vibrations), which may be a precursor to a leak or complete failure.

Thus, the need exists for a more sensitive method to detect deformations in a waveguide or waveguide-like structure.

SUMMARY

One aspect of the present invention relates to a method for monitoring the state of health of a waveguide or waveguide-like structure by launching a probe RF waveform down the waveguide. The return, i.e., signature, RF waveform from this launched probe RF waveform is then monitored, with changes in the signature RF waveform indicating a change in the waveguide, for example, a deformation.

In at least one embodiment, an RF transmitter launches a probe RF waveform down a waveguide or waveguide-like structure. A health RF receiver receives a signature RF waveform from the waveguide due to the probe RF waveform being reflected by one or more features within the waveguide. A health processing system then compares the signature RF waveform (or data representing the signature RF waveform) with a baseline signature RF waveform (or data representing the signature RF waveform) taken when the waveguide was known to be healthy. Alternatively, if a baseline signature RF waveform does not exist, the health processing system could monitor the signature RF waveform (or data representing the signature RF waveform), for changes. If the signature RF waveform differs from the baseline signature RF waveform (or simply changes if no baseline signature RF waveform exists), perhaps by some threshold amount, the health processing system generates a warning signal. The system may then automatically take some predetermined action based upon the warning signal, or may pass the warning signal on to the operator of the system for further action.

In at least one other embodiment, a health monitoring system, like the one just described, operates in parallel with a power charging system. Specifically, in parallel with the health monitoring aspects of the previously described embodiment, a portion of the high-power probe RF waveform is received and absorbed by one or more power RF receivers. The absorbed portion of the high-power probe RF waveform is used to power one or more corresponding power processing systems. The power processing systems may be used to implement various functions along the waveguide structure without the need to hardwire power or a data communication channel to possibly remote portions of the waveguide structure. These various functions may include, for example, measuring various properties of the material in the waveguide structure, such as temperature, pressure, flowrate, etc. If a power processing system determines that a property changes, for example, the temperature suddenly increases, the power processing system may send a warning signal back to the health RF receiver for further action. Alternatively, or in addition to, the power processing system may take local action based upon the change in material property. Stated differently, the health processing system is monitoring for changes in the signature RF waveform due to bends, flexes, vibrations (or changes in vibrations), or separations, what may be termed passive modulation of the probe RF signal due to mechanical deformation of the waveguide structure. In addition, the health processing system is monitoring for changes in temperature, pressure, flowrate, etc., what may be termed active modulation as sensing these traits uses active sensors requiring power, communications, etc.

In at least one embodiment, a waveguide health system comprises a radio frequency (RF) transmitter (the RF transmitter including a transmit antenna, the RF transmitter transmits a probe RF waveform into a waveguide), an RF receiver (the RF receiver including a receive antenna, the RF receiver receives a signature RF waveform from the waveguide, the signature RF waveform due to an interaction of the probe RF waveform with the waveguide, the signature RF waveform including indicia of one or more of a bend, a flex, a vibration, a change in vibration, and a separation of the waveguide), and a health processing system (the health processing system compares a digital representation of the signature RF waveform with a digital representation of a baseline signature RF waveform or a digital representation of a previously stored signature RF waveform and generates a warning signal when the comparison indicates a difference between the digital representation of the signature RF waveform and the digital representation of the baseline signature RF waveform or the digital representation of the previously stored signature RF waveform).

In other embodiments, a frequency of the probe RF waveform causes the waveguide health system to operate in a single propagating mode regime; the waveguide health system employs a homodyne Doppler technique; a frequency of the probe RF waveform is a factor of at least ten higher than that required to cause the waveguide health system to operate in a single propagating mode regime and the probe RF waveform is adapted to propagate unguided within the waveguide or the transmit and receive antennas comprise imaging type two-dimensional transmit and receive antennas, respectively; the probe RF waveform is at least one of a single frequency, multiple distinct frequencies, a band of frequencies, continuous in time, or a series of pulses; and the transmit antenna and the receive antenna form a transceiver antenna.

In yet other embodiments, the health processing system includes a health signal processor (the health signal processor executes instructions), an algorithm memory (the algorithm memory stores instructions that, when executed by the health signal processor, cause the health signal processor to undertake the steps of comparing the digital representation of the signature RF waveform with the digital representation of the baseline signature RF waveform or the digital representation of the previously stored signature RF waveform and generating a warning signal when the step of comparing indicates a difference between the signature RF waveform and the digital representation of the baseline signature RF waveform or the digital representation of the previously stored signature RF waveform), and a waveform memory (the waveform memory stores at least one of the digital representation of the baseline signature RF waveform or the digital representation of the previously stored signature RF waveform).

In still other embodiments, the waveguide health system further comprises one or more reflection elements (each of the one or more reflection elements located within the waveguide, each of the one or more reflection elements creates a corresponding modulation feature in the signature RF waveform); and the RF transmitter is located at a first end of the waveguide and the RF receiver is located at a second end of the waveguide opposite the first end of the waveguide or at a location between the first end of the waveguide and the second end of the waveguide or the RF transmitter is located between the first end of the waveguide and the second end of the waveguide and the RF receiver is located at the first end of the waveguide.

In at least one embodiment, a waveguide health and wireless charging system comprises a radio frequency (RF) transmitter (the RF transmitter including a transmit antenna, the RF transmitter transmits a high-power probe RF waveform into a waveguide), an RF receiver (the RF receiver including a receive antenna, the RF receiver receives a signature RF waveform from the waveguide, the signature RF waveform due to an interaction of the high-power probe RF waveform with the waveguide, the signature RF waveform including indicia of one or more of a bend, a flex, a vibration, a change in vibration, and a separation of the waveguide), a health processing system (the health processing system compares a digital representation of the signature RF waveform with a digital representation of a baseline signature RF waveform or a digital representation of a previously stored signature RF waveform and generates a warning signal when the comparison indicates a difference between the digital representation of the signature RF waveform and the digital representation of the baseline signature RF waveform or the digital representation of the previously stored signature RF waveform), and at least one power RF receiver, each of the at least one power RF receivers including a power receive antenna (the power receive antenna receives a portion of the high-power probe RF waveform), an RF rectifier (the RF rectifier rectifies the received portion of the high-power probe RF waveform), an RF switch (the RF switch couples or decouples the power receive antenna and the RF rectifier such that when the RF switch couples the power receive antenna to the RF rectifier, an impedance of the power RF receiver is substantially equal to a characteristic impedance of the waveguide, and when the RF switch decouples the power receive antenna from the RF rectifier, the impedance of the power RF receiver is substantially greater than the characteristic impedance of the waveguide), an energy storage element (the energy storage element receives and stores the rectified received portion of the high-power probe RF waveform), and a power processing system (the power processing system controls the RF switch based on at least a state of charge of the energy storage element).

In other embodiments, a frequency of the probe RF waveform causes the waveguide health system to operate in a single propagating mode regime; the waveguide health and wireless charging system employs a homodyne mixer technique; the probe RF waveform is at least one of a single frequency, multiple distinct frequencies, a band of frequencies, continuous in time, or a series of pulses; and the transmit antenna and the receive antenna form a transceiver antenna.

In yet other embodiments, the health processing system includes a health signal processor (the health signal processor executes instructions), an algorithm memory (the algorithm memory stores instructions that, when executed by the health signal processor, cause the health signal processor to undertake the steps of comparing the digital representation of the signature RF waveform with the digital representation of the baseline signature RF waveform or the digital representation of the previously stored signature RF waveform and generating the warning signal when the step of comparing indicates a difference between the signature RF waveform and the digital representation of the baseline signature RF waveform or the digital representation of the previously stored signature RF waveform), and a waveform memory (the waveform memory stores at least one of the digital representation of the baseline signature RF waveform or the digital representation of the previously stored signature RF waveform).

In still other embodiments, the waveguide health and wireless charging system further comprises one or more reflection elements (each of the one or more reflection elements located within the waveguide, each of the one or more reflection elements creates a corresponding modulation feature in the signature RF waveform); the RF transmitter is located at a first end of the waveguide and the RF receiver is located at a second end of the waveguide opposite the first end of the waveguide or at a location between the first end of the waveguide and the second end of the waveguide, or the RF transmitter is located between the first end of the waveguide and the second end of the waveguide and the RF receiver is located at the first end of the waveguide; each of the at least one power RF receivers further includes a power conditioning circuit (the power condition circuit increases an overall efficiency of the corresponding power RF receivers), and the power processing system controls the power conditioning circuit; each of the at least one power RF receivers further includes a sensor (the sensor senses a property of a material in the waveguide and outputs an indicia of the sensed property of the material in the waveguide), each of the at least one power RF receivers implements transceiver functionality, the power processing system of each of the at least one power RF receivers generates a corresponding state-of-health communication based upon the corresponding outputted indicia of the sensed property of the material in the waveguide, and the power processing system of each of the at least one power RF receivers outputs the corresponding state-of-health communication using the transceiver functionality; and each of the at least one power RF receivers further includes an actuator (the actuator takes local action), the power processing system of each of the at least one power RF receivers controls the corresponding one of the actuators, and the power processing system of each of the at least one power RF receivers initiates control of the corresponding one of the actuators autonomously or based upon a command carried by the high-power probe RF waveform.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 6A illustrates an RF-based waveguide health monitoring system in accordance with one or more embodiments, while

DETAILED DESCRIPTION

Figure 1A:
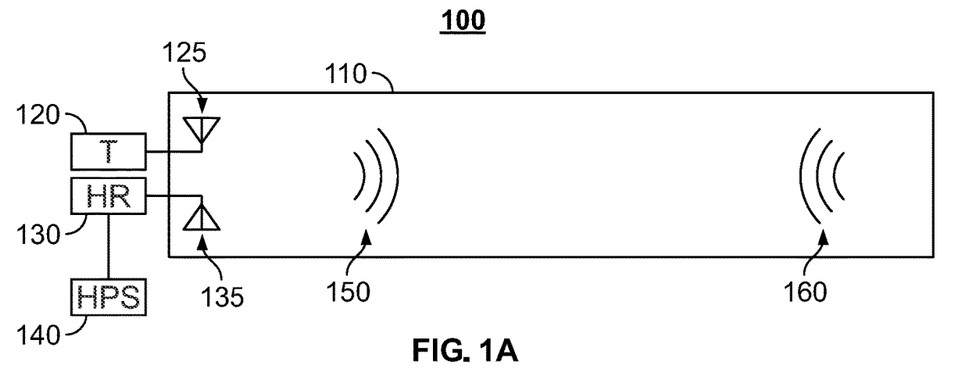
FIGS. 1A-1C illustrate three classes of embodiments of the present invention for an RF-based waveguide health monitoring system.
Figure 1B:
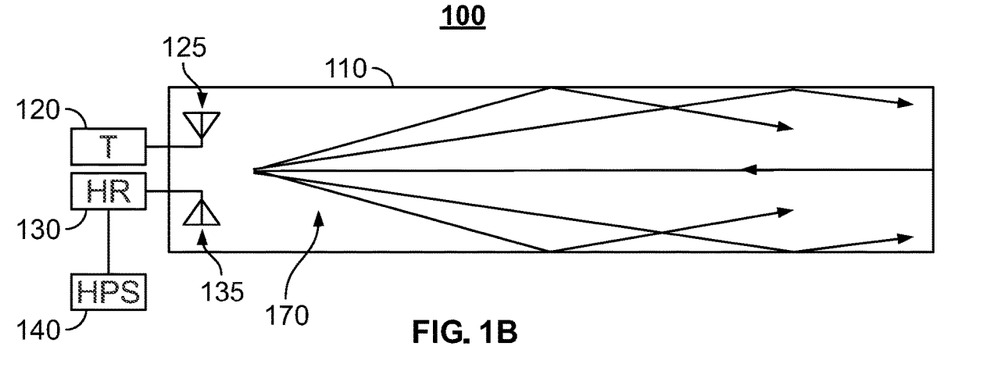
Figure 1C:
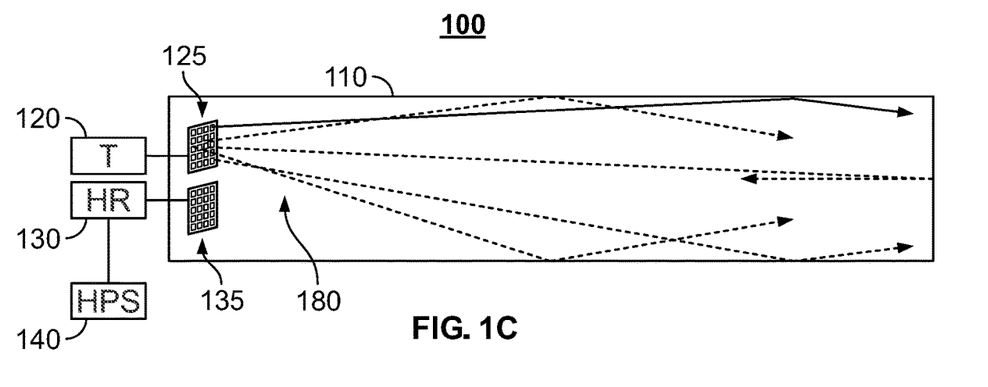

FIGS. 1A-1C illustrate three classes of embodiments of the present invention for an RF-based waveguide health monitoring system 100. The health monitoring system 100 monitors the health of a waveguide 110. The health monitoring system 100 includes an RF transmitter 120, which includes, for example, a probe RF waveform generator (not illustrated) for generating a probe RF waveform 150, a transmit antenna 125 for transmitting the probe RF waveform 150, and a feed from the probe RF waveform generator to the transmit antenna 125. The health monitoring system 100 further includes an RF receiver 130, which includes, for example, a receive antenna 135 for receiving the signature RF waveform 160, a signature RF waveform sensor (not illustrated) for sensing the signature RF waveform 160, and a feed from the receive antenna 135 to the signature RF waveform sensor. The output from the signature RF waveform sensor is fed to a health processing system 140. The health processing system 140 analyzes the output from the signature RF waveform sensor by, at least in part, comparing the current output (or data corresponding thereto) from the signature RF waveform sensor with a baseline output (or data corresponding thereto) corresponding to the signature RF waveform obtained when the waveguide 110 was known to be healthy.

Figure 2:
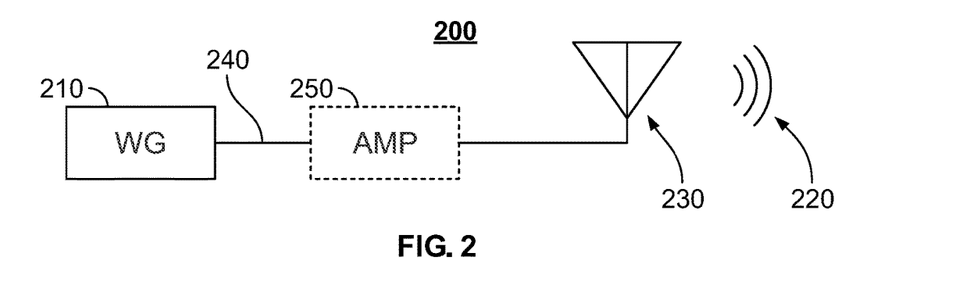
FIG. 2 illustrates a health RF transmitter in accordance with one or more embodiments.

FIG. 2 illustrates an RF transmitter 200 (120), in accordance with at least one embodiment. The RF transmitter 200 includes the probe RF waveform generator 210 for generating the probe RF waveform 220, the transmit antenna 230 for transmitting the probe RF waveform 220, and the feed 240 for transferring the probe RF waveform 220 from the probe RF waveform generator 210 to the transmit antenna 230. The probe RF waveform 220 generated by the probe RF waveform generator 210 may have a single frequency, may have multiple distinct frequencies, or may be chirped over a band of frequencies. In any of these frequency embodiments, the probe RF waveform 220 may be continuous or a series of pulses. In certain embodiments, for example, when the RF transmitter 120 is not collocated with the health RF receiver 130, the probe RF waveform 220 may be modulated with data, for example, to transmit data from the RF transmitter 120 to the RF receiver 130.

In various embodiments, the RF transmitter 200 may include an optional amplifier 250 to boost the power in the probe RF waveform 220. This optional amplifier 250 may be required, for example, if the media within the waveguide 110 strongly absorbs the probe RF waveform 220 or the waveguide 110 is relatively long. To at least partially counter this absorption, the frequency of the probe RF waveform 220 is preferably selected to minimize, or at least reduce, absorption by the media within the waveguide 110.

Figure 3:
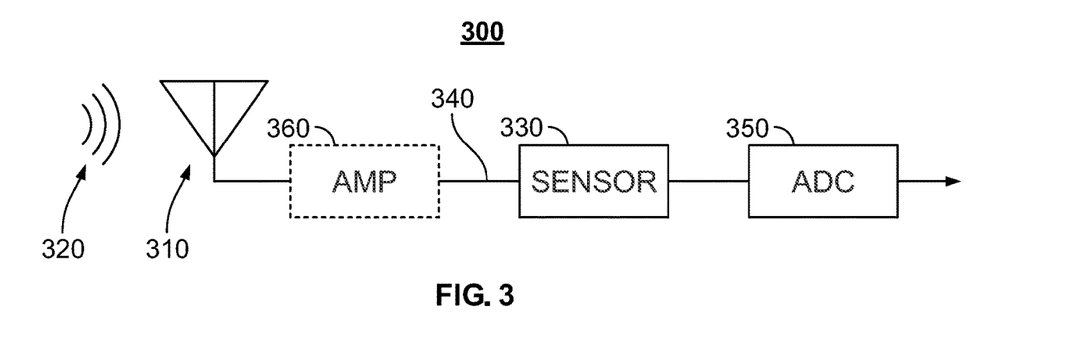
FIG. 3 illustrates a health RF receiver in accordance with one or more embodiments.

FIG. 3 illustrates an RF receiver 300 (130), in accordance with at least one embodiment. The RF receiver 300 includes the receive antenna 310 for receiving the signature RF waveform 320, the signature RF waveform sensor 330 for sensing the signature RF waveform 320, and the feed 340 for transferring the signature RF waveform 320 from the receive antenna 310 to the signature RF waveform sensor 330. The signature RF waveform 320 corresponds to the probe RF waveform 150 after it has interacted with the waveguide 110. This interaction of the probe RF waveform with the waveguide 110 will cause the signature RF waveform 320 to include indicia of bends, flexes, vibrations (or changes in vibrations), or separations of the waveguide 110. The analog output from the signature RF waveform sensor 330 is then converted into a digital representation of the signature RF waveform by an analog-to-digital converter (ADC) 350. In various embodiments, an optional amplifier 360 may be located between the receive antenna 310 and the signature RF waveform sensor 330 to boost the power of the signature RF waveform 320.

As will be appreciated by those of ordinary skill in the art, the RF transmitter 120 and the RF receiver 130 may be combined into a single RF transceiver in certain embodiments. A single RF transceiver may simplify the design as a single antenna for both transmit and receive functions may be employed. If the reception of the signature RF waveform will overlap with the transmission of the probe RF waveform, then a full duplex RF transceiver will be required.

Figure 4:
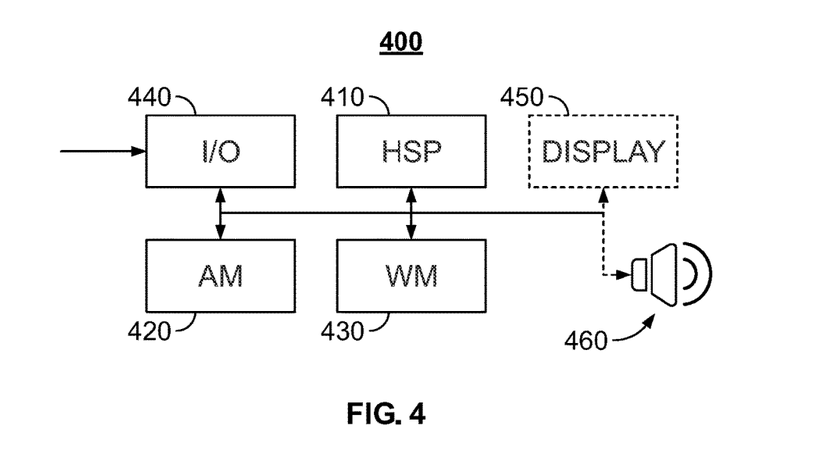
FIG. 4 illustrates a health processing system in accordance with one or more embodiments.

FIG. 4 illustrates a health processing system 400 (140), in accordance with at least one embodiment. The health processing system 400 includes, for example, a health signal processor 410, an algorithm memory 420, and a waveform memory 430. Upon receiving the digital representation of the signature RF waveform 160 from the RF receiver 130 via an I/O interface 440, the health signal processor 410 processes the digital representation of the signature RF waveform 160 based upon the algorithm stored in the algorithm memory 420. The algorithm includes instructions to compare the digital representation of the signature RF waveform 160 with a digital representation of a baseline signature RF waveform stored in the waveform memory 430. The digital representation of a baseline signature RF waveform corresponds to the signature RF waveform 160 when the waveguide 110 was known to be healthy. In alternative embodiments, a baseline signature RF waveform may not be known. In these embodiments, the algorithm includes instructions to compare the digital representation of the signature RF waveform 160 with a digital representation of a previously stored signature RF waveform from the waveform memory 430. If the comparison of the digital representation of the signature RF waveform 160 with the digital representation of a baseline (or previously stored) signature RF waveform shows a difference, perhaps exceeding some threshold value, then instructions in the algorithm cause the health signal processor 410 to generate a warning signal. Upon generating this warning signal, the health signal processor 410 may undertake further actions automatically. For example, the algorithm may include instructions to cause the health signal processor 410 to shut down one or more pumps in the example of a petroleum transmission pipeline. Alternatively, or in addition, the algorithm may include instructions that cause the health signal processor 410 to display a warning to a system operator on an optional display 450 and/or sound an alarm on an optional loudspeaker 460.

While the RF receiver 300 illustrated in FIG. 3 includes an ADC 350, in other embodiments, the ADC 350 may be included as part of the health processing system 400 rather than as part of the RF receiver 300.

At least three classes of embodiments of the present invention are contemplated for the RF transmitter 120, the RF receiver 130, and the health processing system 140. The first class of embodiments, illustrated in FIG. 1A, employs a relatively low frequency probe RF waveform 150 operating in the single propagating mode regime. As will be appreciated by those of ordinary skill in the art, the dimensions and cross-sectional shape of the waveguide 110, as well the dielectric constant of the media within the waveguide 110, will determine the frequency of the single propagating mode regime. With this first class of embodiments, the probe RF waveform 150 is guided by the waveguide 110, with longitudinal mode vibrations of the waveguide 110 imparting information on the probe RF waveform 150 to form the signature RF waveform 160. The health processing system 140 may then determine the length of the waveguide 110, with a change in length indicating, for example, a bend, a flex, a break, a vibration, or other failure of the waveguide 110.

Figure 5A:
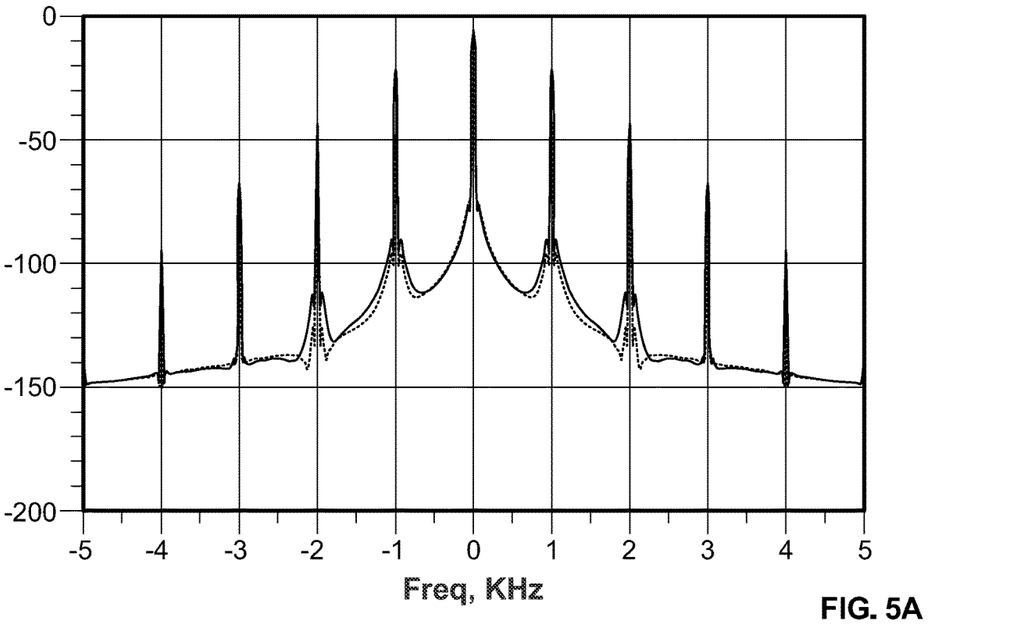
FIGS. 5A and 5B illustrate an exemplary signature RF waveform in accordance with a first class of embodiments.
Figure 5B:
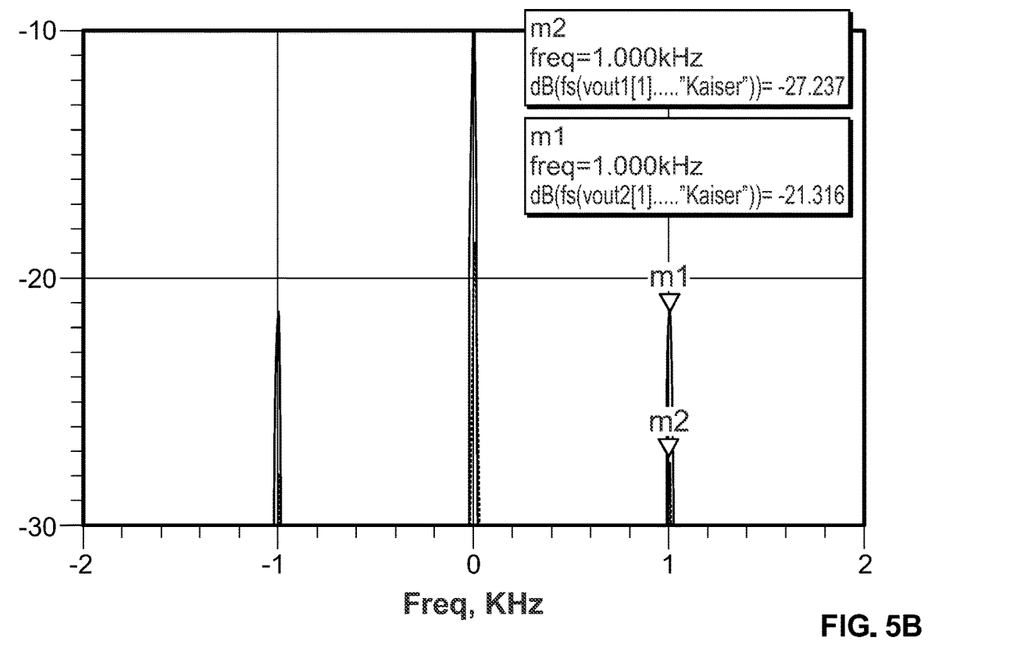

In this first class of embodiments, the waveguide 110 will frequently operate below 1 GHz, again subject to the requirement of operating in the single propagating mode regime. In this case, a classic homodyne Doppler technique, which is common in traffic enforcement radars and automatic door openers, can be used. See, for example, G.L. Charvat, "Small and Short-Range Radar Systems," CRC Press, ch. 2 (2014), the contents of which are incorporated herein by reference. In this first class of embodiments, a single-frequency probe RF waveform 150 is launched into the waveguide 110. The probe RF waveform 150 propagates down the waveguide 110 and reflects off any internal features. The phase of the signature RF waveform 160 received by the RF receiver 130 is proportional to the distance to the internal features. Further, a longitudinal vibration of the waveguide 110 will frequency modulate the probe RF waveform 150 forming the signature RF waveform 160. This adds Doppler sidebands to the signature RF waveform 160 whose amplitudes are related to the amplitude of the longitudinal vibration. This concept is illustrated in FIGS. 5A and 5B.

Detection and processing of the Doppler sidebands in the signature RF waveform 160 can reveal the mechanical deviation of the waveguide 110 from its initial shape. In the example illustrated in FIGS. 5A and 5B, a 200 MHz probe RF waveform 150 is modulated first by $\pm 10°$ phase at 1 kHz (dashed line) and then by $\pm 20°$ phase at 1 kHz (solid line). The resulting signal spectra show that the 1 kHz sideband amplitude is related to the amount of phase modulation and thus the amplitude of the waveguide 110 longitudinal vibration. This is especially evident in FIG. 5B, in which the first side band at 1 kHz with the $\pm 20°$ phase modulation is 6 dB greater than the $\pm 10°$ phase modulation.

For the first class of embodiments, one challenge is obtaining the desired sensitivity. Deformations significant enough to warrant detection may cause only a few degrees of phase modulation. While radio circuits may be designed to be exquisitely sensitive, large signal-to-noise ratios (SNRs) will likely be required. If the material within the waveguide 110 has very low loss at the frequency of the probe RF waveform 150 or the length of the waveguide 110 is modest, then achieving large SNRs is feasible. The desired SNR may also be achieved to some extent by launching a higher-power probe RF waveform 150 and through advanced signal processing techniques.

Factors that may impact sensitivity in the first class of embodiments are phase noise and thermal noise, with phase noise generally being of greater concern. In certain embodiments, the issue of phase noise may be overcome using the homodyne Doppler technique that greatly improves the SNR. In the homodyne Doppler technique, the signature RF waveform 160 is mixed with the RF waveform 150 to recover the desired baseband information. To accomplish this, the RF waveform 150 is divided before it is injected into the waveguide 110. A portion of the RF waveform 150 is injected into the waveguide 110, while the balance is used as the local oscillator (LO) for an image-reject mixer. Because both the RF and LO signals contain the same phase noise (apart from the short-time delay of the waveguide 110, which can be easily compensated for using a delay line on the LO), the phase noise will substantially cancel in the baseband output, leaving only the desired modulated information from the signature RF waveform 160 with substantially only thermal noise. In a similar manner, the homodyne mixer technique should provide immunity to oscillator-pulling, which is a common phenomenon with some RF waveform generators 210. In this way, the system may approach, to a significant extent, thermal-noise limits with very high SNRs, e.g., >>30dB.

Perhaps the simplest way to understand the first class of embodiments is as a mechanical phase modulator. For a displacement dz, the change in phase is:

$$\theta = 2\, dz\, \beta_z, \quad \text{(Eq. 1)}$$

where $\beta_z$ is the phase constant of the waveguide 110 (in units of radians per meter). The factor of two in Eq. 1 accounts for the fact that one is measuring a reflection, i.e., the signal traverses the waveguide 110 in both the forward and reverse directions resulting in a round-trip phase shift. The phase constant is a function of frequency, the dimensions of the waveguide 110, and the dielectric constant of the media within the waveguide 110.

For phase, i.e., exponential, modulation, one can define a modulated signal of unit amplitude carrier at radian frequency $\omega_c$ as:

$$\varphi(t) = \text{Real}(\exp(j\omega_c t)\, \exp(\emptyset(t))). \quad \text{(Eq. 2)}$$

Expanding $\exp(\emptyset(t))$ in a power series and taking the real part yields:

$$\varphi(t) = \cos\omega_c t - \phi(t)\sin\omega_c t - \frac{\phi(t)^2}{2!}\cos\omega_c t + \frac{\phi(t)^3}{3!}\sin\omega_c t + \ldots . \quad \text{(Eq. 3)}$$

Because the phase deviations are small in the present case, i.e., $|\emptyset(t)| \ll 1$, one makes the narrowband-FM approximation, see B.P. Lathi, "Modern Digital and Analog Communication Systems," Oxford University Press, 3rd Ed., p. 216 (1998), the contents of which are incorporated herein by reference, that:

$$\varphi(t) \sim \cos\omega_c t - \emptyset(t)\sin\omega_c t. \quad \text{(Eq. 4)}$$

The amplitude of the phase-quadrature component of the signal is thus $\emptyset(t)=2\,\beta_z\, dz(t)$, from which the desired information $dz(t)$ is easily recovered. In addition, from Eq. 4, one can also estimate the amplitude of the information sideband with respect to the carrier.

In the second class of embodiments, illustrated in FIG. 1B, the RF transmitter 120 and the RF receiver 130 employ high frequency probe RF waveform rays 170, for example, a factor of at least ten higher than the frequencies employed in the single propagating mode regime used in the first class of embodiments. With this second class of embodiments, the probe RF waveform rays 170 propagate unguided within the waveguide 110. The health processing system 140 may then detect potential bends, flexes, vibrations (or changes in vibrations), or separations along the length of the waveguide 110 due to transit time-based features in the signature RF waveform.

In the second class of embodiments, the RF transmitter 120 launches a set of high frequency probe RF waveform rays 170 at multiple angles simultaneously. These probe RF waveform rays 170 are not strongly bound to the walls of the waveguide 110 and may thus propagate at any angle within the waveguide 110. The probe RF waveform rays 170 reflect from the walls of the waveguide 110, perhaps bouncing multiple times, and then return to the RF receiver 130. The health processing system 140 may then reconstruct some aspects of the shape of the waveguide 110 based on the returning signature RF waveform. See, for example, J. Mast et al., "Micropower Impulse Radar Technology and Applications," Lawrence Livermore National Laboratory report UCRL-ID-130474 (1998), the contents of which are incorporated herein by reference.

In the third class of embodiments, illustrated in FIG. 1C, the RF transmitter 120 and the RF receiver 130 again employ a high frequency probe RF waveform 180, for example, a factor of at least ten higher than the frequencies employed in the single propagating mode regime used in the first class of embodiments. With this third class of embodiments, the RF transmitter 120 and RF receiver 130 are of the imaging type (e.g., phased array type), with a two-dimensional (2D) transmit antenna 125 and a corresponding 2D health receive antenna 135. The 2D transmit antenna 125 launches high frequency probe RF waveforms 180 sequentially from each element of the 2D transmit antenna 125, for example in a raster fashion. The returning sequence of signature RF waveforms may then be processed by the health processing system 140 to create a tomographic three-dimensional (3D) point cloud of the interior of the waveguide 110. See, for example, M.T. Ghasr et al., "Wideband Microwave Camera for Real-Time 3-D Imaging," IEEE Transactions on Antennas and Propagation, vol. 65, no. 1, pp. 258-268 (2017), the contents of which are incorporated herein by reference. By monitoring this 3D point cloud of the interior of the waveguide 110 for changes, the health processing system 140 may detect bends, flexes, vibrations (or changes in vibrations), or separations along the length of the waveguide 110.

While the RF receiver 300 and health processing system 400 were described above with reference to receiving and comparing the signature RF waveform, the RF receiver 300 and health processing system 400 may be adapted to receive data. For example, in certain embodiments when the RF transmitter 120 is not collocated with the RF receiver 130, the RF transmitter 120 may modulate the probe RF waveform with data to send information from the RF transmitter 120 to the RF receiver 130, and thus to the health processing system 140. In this embodiment, the algorithm stored in the algorithm memory 420 will include instructions that cause the health signal processor 410 to demodulate the probe (or signature) RF waveform to recover the data.

Figure 6A:
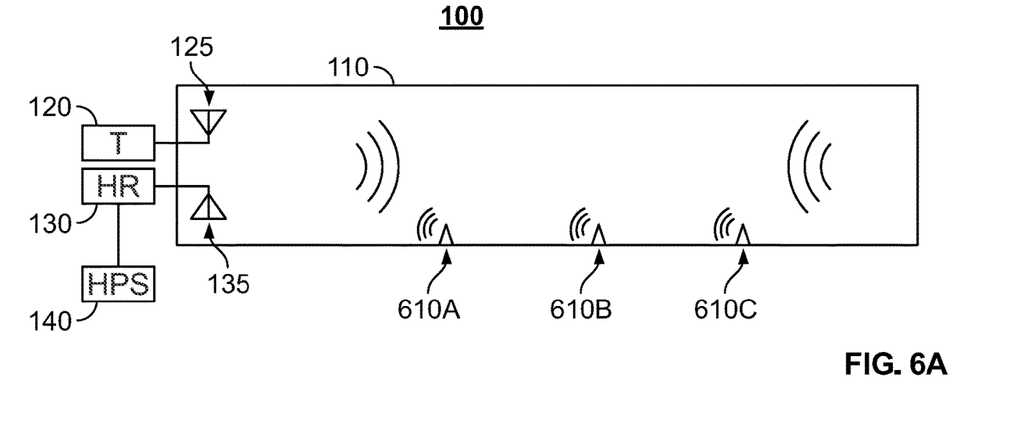
Figure 6B:
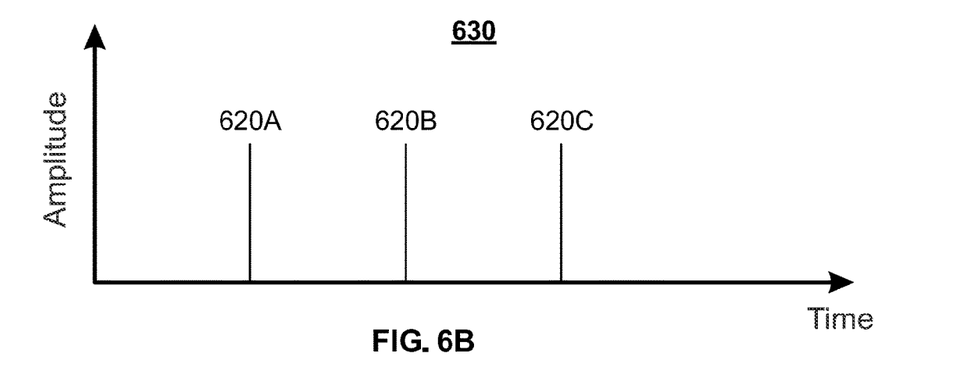
FIGS. 6B and 6C illustrate corresponding signature RF waveforms.
Figure 6C:
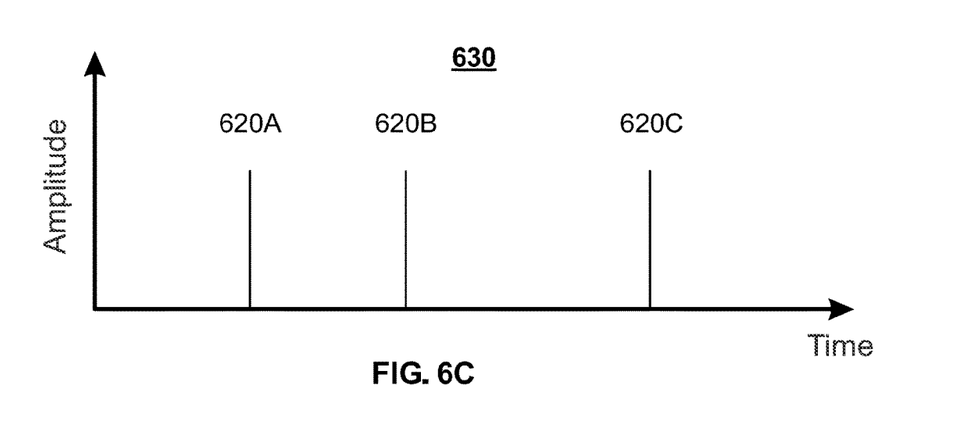

To assist in determining the location of any change in the waveguide 110, one or more reflection elements 610A, 610B, 610C may be placed at corresponding locations along the length of the waveguide 110, as illustrated in FIG. 6A. These one or more reflection elements 610A, 610C, 610C will create corresponding modulation features 620A, 620B, 620C in the signature RF waveform 630, as illustrated in FIG. 6B. When the health processing system 140 analyzes the output from the health RF receiver 130 and detects a change with respect to one of these features 620A, 620B, 620C, for example feature 620C as illustrated in FIG. 6C, the location of the deformation, for example, a bend, flex, vibration, or separation, in the waveguide 110 may be estimated. In this example, the difference is a delay in receiving feature 620C, which may indicate a lengthening of the distance between reflection element 610B and reflection element 610C due, for example, to a deformation of the waveguide 110 between reflection element 610B and reflection element 610C.

Figure 7A:
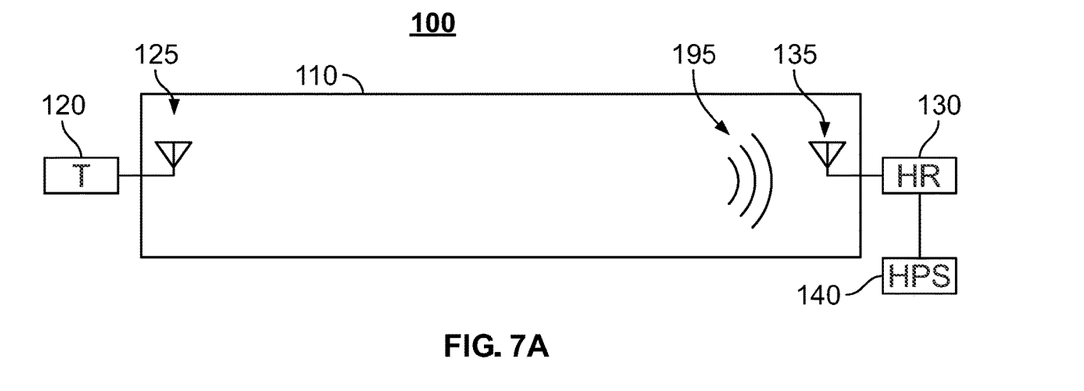
FIGS. 7A-7C illustrate RF-based waveguide health monitoring systems having various configurations in accordance with various embodiments.
Figure 7B:
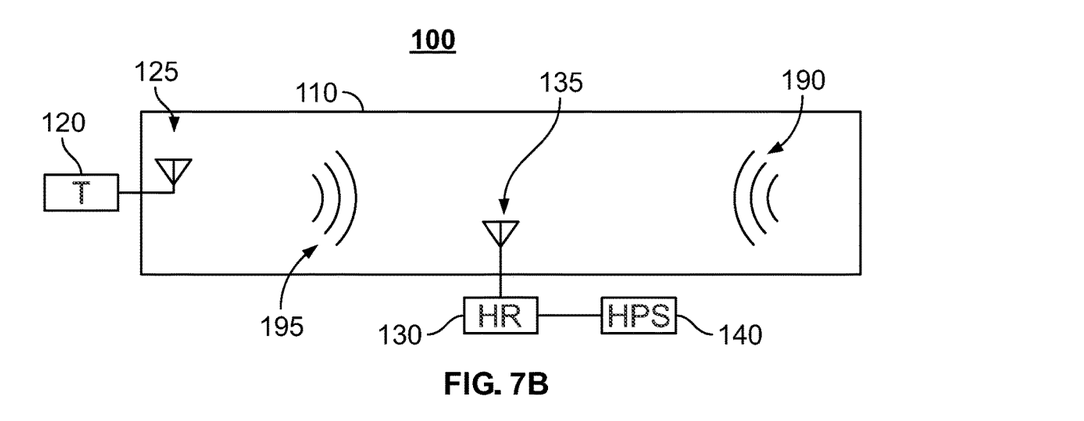
Figure 7C:
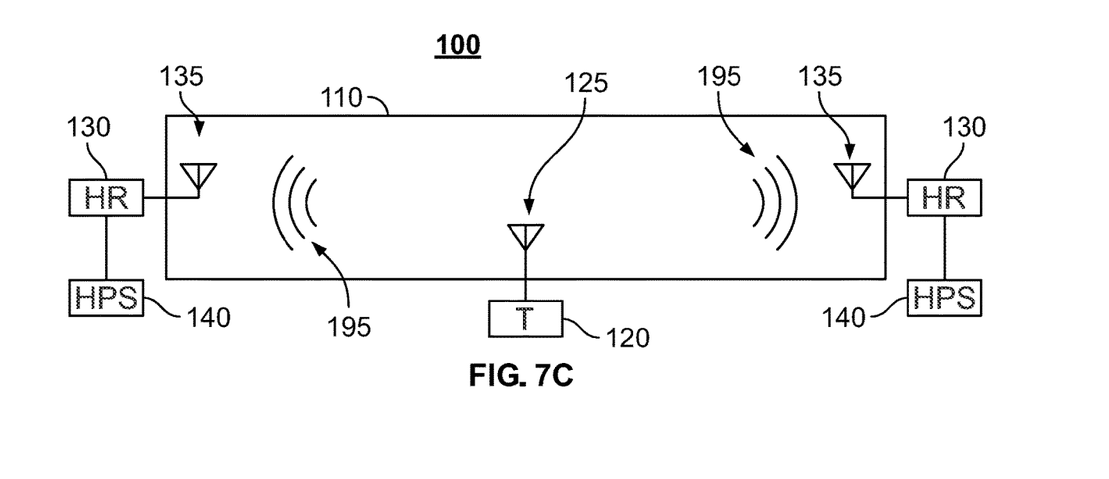

While the embodiments of the RF-based waveguide health monitoring system 100 illustrated in FIGS. 1A-1C have the RF transmitter 120 and the RF receiver 130 co-located at the same end of the waveguide 110, in other embodiments, the RF transmitter 120 and the RF receiver 130 may be located at opposite ends of the waveguide 110, as illustrated in FIG. 7A. In this case, the RF receiver 130 receives not a reflected signature RF waveform 190, but a version of the probe RF waveform that has been modified by the waveguide 110 and any potential deformations therein, i.e., a transmitted signature RF waveform 195. In still other embodiments, the RF transmitter 120 may be located at one end of the waveguide 110, while the RF receiver 130 is located between the two ends of the waveguide 110, as illustrated in FIG. 7B. In this case, the RF receiver 130 receives both a reflected signature RF waveform 190 and a transmitted signature RF waveform 195, with one or both of the reflected and transmitted signature RF waveforms 190, 195 potentially being modified by any deformations within the waveguide 110. In yet other embodiments, the RF transmitter 120 may be located between the two ends of the waveguide 110, while a first RF receiver 130 is located at a first end of the waveguide 110 and a second RF receiver 130 is located at a second end of the waveguide 110, as illustrated in FIG. 7C. In this case, both RF receivers 130 receive transmitted signature RF waveforms 195, with one or both of the RF receivers 130 receiving transmitted signature RF waveforms 195 potentially being modified by any deformations within the waveguide 110.

While a metal petroleum transmission pipeline has been used as an exemplary waveguide or waveguide-like structure, various embodiments may be used with other waveguides. For example, the waveguide may be a metal petroleum downhole pipeline being monitored for potential deformation due, for example, to the pressure used in a hydraulic fracturing (fracking) process. As yet another example, the waveguide may be the ductwork for a heating, ventilation, and air-conditioning (HVAC) system being monitored for potential leaks due to repeated expansion/contraction of the ductwork from repeated heating and cooling cycles. Yet another example could be a double hull ship being monitored for potential damage to the outer (or inner) hull.

Figure 8:
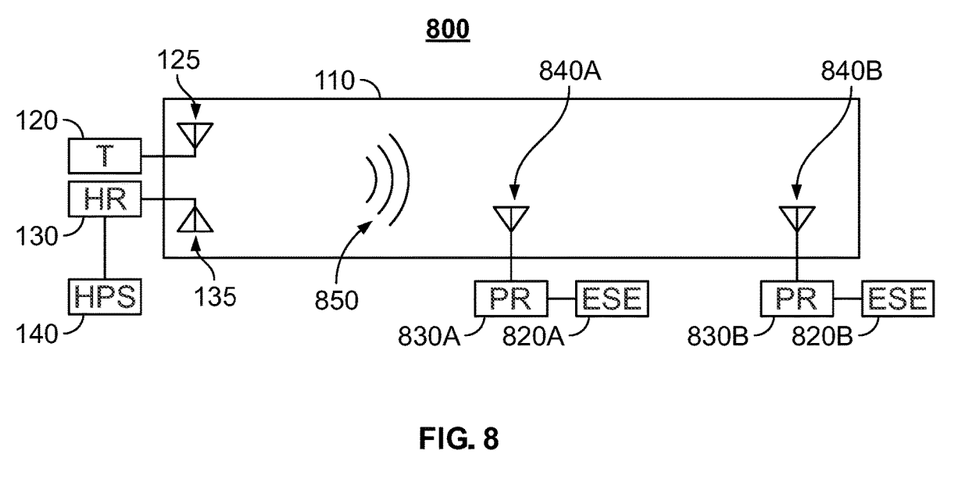
FIG. 8 illustrates a hybrid waveguide health and wireless charging system in accordance with various embodiments.

Significant additional functionality may be added to the waveguide health monitoring systems described above if the power in the probe RF waveform is great enough. In particular, a wireless charging system may be implemented in parallel with the waveguide health monitoring system, thereby creating a hybrid waveguide health and wireless charging system 800, as illustrated in FIG. 8. The wireless charging portion of the hybrid waveguide health and wireless charging system 800 employs a waveguide 110 and charges a series of energy storage elements 820A, 820B by changing the impedance of corresponding power RF receivers 830A, 830B and power receive antennas 840A, 840B used to charge the energy storage elements 820A, 820B. For example, when an energy storage element 820A is not charged, its corresponding power RF receiver 830A is placed in an impedance matched state such that it receives power from a high-power probe RF waveform 850 transmitted by an RF transmitter 120 and corresponding transmit antenna 125 to efficiently charge the energy storage element 820A. Once the energy storage element 820A is charged, its corresponding power RF receiver 830A is placed in an open circuit state with an impedance much greater than the characteristic impedance of the wireless charging portion of the hybrid waveguide health and wireless charging system 800 such that little or no power in the high-power probe RF waveform 850 is absorbed by the power RF receiver 830A and power receive antenna 840A. The high-power probe RF waveform 850 may then be received by another power RF receiver 830B in the wireless charging portion of the hybrid waveguide health and wireless charging system 800, and its corresponding energy storage element 820B charged. In this manner, each of the energy storage elements 820A, 820B may be charged sequentially.

One significant advantage of this approach is that a single electro-magnetic field mode, preferably the fundamental mode, may be shared among many power RF receivers 830A, 830B, i.e., the RF transmitter 120 is time-shared among the power RF receivers 830A, 830B. This is a simpler solution than having a separate electro-magnetic field mode for each power RF receiver 830A, 830B (each with a different frequency), as it greatly simplifies the RF transmitter 120 and the process of adding more power RF receivers 830A, 830B to an existing hybrid waveguide health and wireless charging system 800. Further, the use of a single (fundamental) electro-magnetic field mode simplifies the geometries of the transmit antenna 125 and the power receive antennas 840A, 840B, especially as a single antenna design may be used for all of the power receive antennas 840A, 840B. In contrast, if each power receive antenna 840A, 840B were assigned a unique electro-magnetic field mode with a different frequency, the power receive antenna 840A, 840B for each power RF receiver 830A, 830B would need a correspondingly unique design, which makes scaling the hybrid waveguide health and wireless charging system 800 to many power RF receivers 830A, 830B difficult.

The wireless charging portion of the hybrid waveguide health and wireless charging system 800 will now be described in greater detail. FIG. 8 illustrates the charging strategy employed in the wireless charging portion of the hybrid waveguide health and wireless charging system 800 in accordance with at least one embodiment. In a first phase, the RF transmitter 120, via corresponding transmit antenna 125, transmits power in the form of a high-power probe RF waveform 850 through the waveguide 110 to the first and second power RF receivers 830A, 830B, at corresponding first and second locations in the waveguide 110, to charge corresponding energy storage elements 820A, 820B. The high-power probe RF waveform 850 must transmit sufficient power to enable charging of the most distant energy storage element 820B. The first and second power RF receivers 830A, 830B, and their corresponding power receive antennas 840A, 840B, are initially in an impedance matched state for charging to occur. In a second phase, the energy storage element 820A associated with the first power RF receiver 830A has been charged and the first power RF receiver 830A, and its corresponding power receive antenna 840A, enter an open circuit state with an impedance much greater than the characteristic impedance of the hybrid waveguide health and wireless charging system 800. By being in an open circuit state, the power transmitted by the RF transmitter 120 now passes on to the second power RF receiver 830B and its corresponding power receive antenna 840B to charge its corresponding energy storage element 820B at an increased rate. The charge and open circuit process occurs sequentially until the energy storage elements 820A, 820B associated with each power RF receiver 830A, 830B has been charged. By employing a traveling wave as the single fundamental electro-magnetic field mode, as opposed to a standing wave, the precise location of the power receive antennas 840A, 840B is not critical as there will not be any nulls in the electro-magnetic field to avoid. If the power receive antenna 840B is close to a source of significant reflection, for example, a highly conductive wall at the end of the waveguide 110 or a change in the shape or size of the waveguide 110, then the location of the power receive antenna 840B may remain critical.

While the just described embodiment employed a traveling wave, a standing wave may be used in other embodiments. In standing wave embodiments, the location of the power receive antennas 840A, 840B will be more critical, as they should be placed at locations corresponding to maximum field intensity to improve coupling to the standing waveguide mode. These maximum field intensity locations may correspond to maximums in the electric field intensity, and such a hybrid waveguide health and wireless charging system 800 would employ power RF receivers 830A, 830B having power receive antennas 840A, 840B. When the maximum field intensity locations correspond to maximums in the magnetic field intensity, then the hybrid waveguide health and wireless charging system 800 would employ power RF receivers 830A, 830B having magnetic probes (not illustrated). Depending upon the precise locations desired for the power RF receivers 830A, 830B, then a mix of power RF receivers 830A, 830B having power receive antennas 840A, 840B and magnetic probes may be required. In yet other embodiments of the invention, the electromagnetic field may be a superposition of standing and traveling waves. In these embodiments, the precise location of the power RF receivers 830A, 830B and their corresponding power receive antennas 840A, 840B will be less critical than in the pure standing wave embodiments, but more critical than in the pure traveling wave embodiments.

Figure 9:
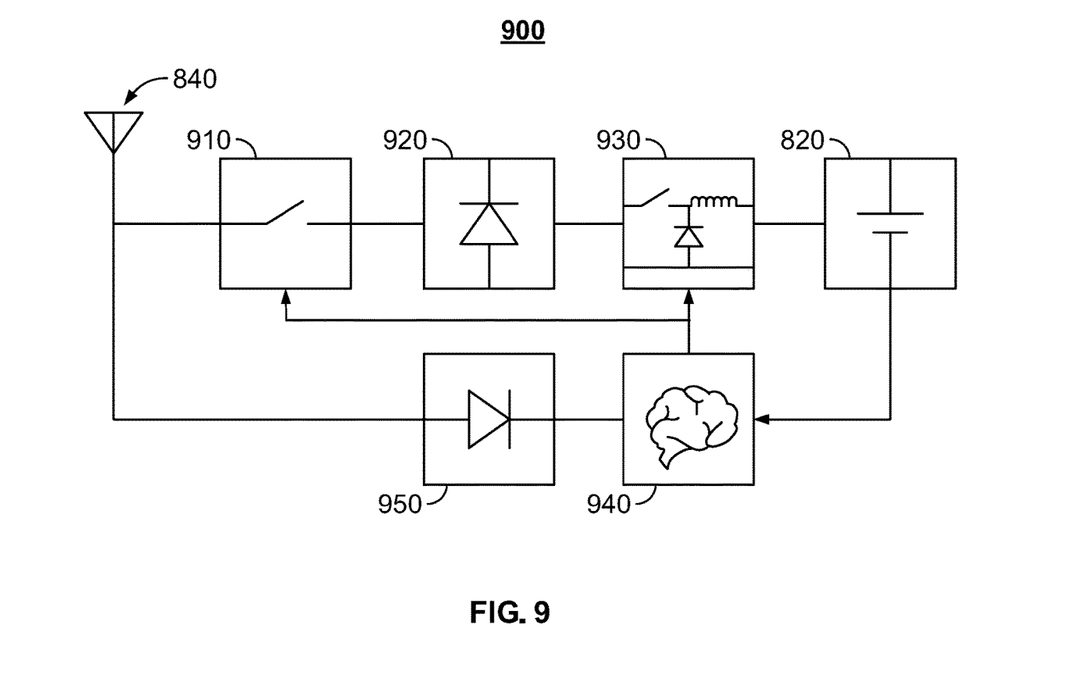
FIG. 9 illustrates a functional block diagram of a power RF receiver in accordance with at least one embodiment.

FIG. 9 illustrates a functional block diagram of a power RF receiver 900 (830) in accordance with at least one embodiment. The power RF receiver 900 includes a power receive antenna 840 connected to an RF switch 910, and from there to an RF rectifier 920. The RF rectifier 920 is connected to an optional power conditioning circuit 930, and from there to the energy storage element 820. A power processing system 940 controls both the RF switch 910 and the power conditioning circuit 930. The power processing system 940 may optionally be powered by a low-power RF rectifier 950 that is always connected to the power receive antenna 910, but at a low enough level to present an impedance much greater than the characteristic impedance of the hybrid waveguide health and wireless charging system 800.

In operation, the power receive antenna 840 captures transmitted RF energy from the high-power probe RF waveform 850 and passes this charging RF signal to the RF rectifier 920 via the RF switch 910. The RF switch 910 serves to change the load impedance the RF rectifier 920 presents to the power receive antenna 840 such that, once the energy storage element 820 is charged, the high-power probe RF waveform 850 can advance to other downstream power RF receivers 900. The RF rectifier 920 converts the high-power probe RF waveform 850 into DC energy. Next, the power conditioning circuit 930, for example a buck, boost, or buck-boost DC-DC converter, serves to increase the efficiency of the overall power RF receiver 900. The output of the power conditioning circuit 930 is fed to the energy storage element 820, which stores the rectified energy at DC until it is needed. The power processing system 940 controls the charge-and-then-open-circuit function of the RF power receiver 900. The power processing system 940 may also provide state-of-health or state-of-charge communication or other functionality. The power processing system 940 may be either analog or digital and may optionally be powered by the low-power RF rectifier 950. The low-power RF rectifier 950 allows the power processing system 940 to operate even when only limited power is being transmitted by the RF transmitter 120. This low power capability may be desirable from a systems or safety viewpoint. For example, the low-power RF rectifier 950 can provide power to the power processing system 940 for generating state-of-health or other communications without turning on the RF switch 910 and charging the energy storage element 820.

The power RF receivers 830A, 830B may be used to implement several functions. These functions may include, for example, monitoring various properties of the material in the waveguide 110, such as temperature, pressure, flowrate, etc. If a corresponding power processing system 940 determines that a property changes, for example, the temperature suddenly increases, the power processing system 940 may send a warning signal back to the health RF receiver 130 using transceiver functionality via the power receive antenna 840 (or a corresponding power transmit antenna, not illustrated) and the health receive antenna 135 for further action. Alternatively, or in addition to, the power processing system 940 may take local action by controlling an actuator (not illustrated). This local action taken by the actuator may include, for example, opening or closing (partially or completely) a valve, turning on or off a heating (or cooling) element, or generating a local audible or visual alarm. The power processing system 940 may initiate this local action autonomously, for example, based upon the change in material property, or based upon a command carried by the high-power probe RF waveform 850.

A more complete description of the wireless charging portion of the hybrid waveguide health and wireless charging system 800 may be found in U.S. patent application Ser. No. 16/435,853, the contents of which are hereby incorporated by reference.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A waveguide health system comprising:
 a radio frequency (RF) transmitter, the RF transmitter including a transmit antenna, the RF transmitter adapted to transmit a probe RF waveform into a waveguide;
 an RF receiver, the RF receiver including a receive antenna, the RF receiver adapted to receive a signature RF waveform from the waveguide, the signature RF waveform due to an interaction of the probe RF waveform with the waveguide, the signature RF waveform including indicia of one or more of a bend, a flex, a vibration, a change in vibration, and a separation of the waveguide; and
 a health processing system, the health processing system adapted to compare a digital representation of the signature RF waveform with a digital representation of a baseline signature RF waveform or a digital representation of a previously stored signature RF waveform and to generate a warning signal when the comparison indicates a difference between the digital representation of the signature RF waveform and the digital representation of the baseline signature RF waveform or the digital representation of the previously stored signature RF waveform.

2. The waveguide health system of claim 1, wherein a frequency of the probe RF waveform is adapted to cause the waveguide health system to operate in a single propagating mode regime.

3. The waveguide health system of claim 1, wherein the waveguide health system employs a homodyne Doppler technique.

4. The waveguide health system of claim 1,
 wherein a frequency of the probe RF waveform is a factor of at least ten higher than that required to cause the waveguide health system to operate in a single propagating mode regime; and wherein the probe RF waveform is adapted to propagate unguided within the waveguide or the transmit and receive antennas comprise imaging type two-dimensional transmit and receive antennas, respectively.

5. The waveguide health system of claim 1, wherein the probe RF waveform is at least one of a single frequency, multiple distinct frequencies, a band of frequencies, continuous in time, or a series of pulses.

6. The waveguide health system of claim 1, wherein the transmit antenna and the receive antenna form a transceiver antenna.

7. The waveguide health system of claim 1, wherein the health processing system includes:
a health signal processor, the health signal processor adapted to execute instructions;
an algorithm memory, the algorithm memory adapted to store instructions that, when executed by the health signal processor, cause the health signal processor to undertake the steps of:
comparing the digital representation of the signature RF waveform with the digital representation of the baseline signature RF waveform or the digital representation of the previously stored signature RF waveform; and
generating a warning signal when the step of comparing indicates a difference between the signature RF waveform and the digital representation of the baseline signature RF waveform or the digital representation of the previously stored signature RF waveform; and
a waveform memory, the waveform memory adapted to store at least one of the digital representation of the baseline signature RF waveform or the digital representation of the previously stored signature RF waveform.

8. The waveguide health system of claim 1 further comprising one or more reflection elements, each of the one or more reflection elements located within the waveguide, each of the one or more reflection elements adapted to create a corresponding modulation feature in the signature RF waveform.

9. The waveguide health system of claim 1,
wherein the RF transmitter is located at a first end of the waveguide and the RF receiver is located at a second end of the waveguide opposite the first end of the waveguide or at a location between the first end of the waveguide and the second end of the waveguide; or
wherein the RF transmitter is located between the first end of the waveguide and the second end of the waveguide and the RF receiver is located at the first end of the waveguide.

10. A waveguide health and wireless charging system comprising:
a radio frequency (RF) transmitter, the RF transmitter including a transmit antenna, the RF transmitter adapted to transmit a high-power probe RF waveform into a waveguide;
an RF receiver, the RF receiver including a receive antenna, the RF receiver adapted to receive a signature RF waveform from the waveguide, the signature RF waveform due to an interaction of the high-power probe RF waveform with the waveguide, the signature RF waveform including indicia of one or more of a bend, a flex, a vibration, a change in vibration, and a separation of the waveguide;
a health processing system, the health processing system adapted to compare a digital representation of the signature RF waveform with a digital representation of a baseline signature RF waveform or a digital representation of a previously stored signature RF waveform, the health processing system adapted to generate a warning signal when the comparison indicates a difference between the digital representation of the signature RF waveform and the digital representation of the baseline signature RF waveform or the digital representation of the previously stored signature RF waveform; and
at least one power RF receiver, each of the at least one power RF receivers including:
a power receive antenna, the power receive antenna adapted to receive a portion of the high-power probe RF waveform;
an RF rectifier, the RF rectifier adapted to rectify the received portion of the high-power probe RF waveform;
an RF switch, the RF switch adapted to couple or decouple the power receive antenna and the RF rectifier such that when the RF switch couples the power receive antenna to the RF rectifier, an impedance of the power RF receiver is substantially equal to a characteristic impedance of the waveguide, and when the RF switch decouples the power receive antenna from the RF rectifier, the impedance of the power RF receiver is substantially greater than the characteristic impedance of the waveguide;
an energy storage element, the energy storage element adapted to receive and store the rectified received portion of the high-power probe RF waveform; and
a power processing system, the power processing system adapted to control the RF switch based on at least a state of charge of the energy storage element.

11. The waveguide health and wireless charging system of claim 10, wherein a frequency of the probe RF waveform is adapted to cause the waveguide health system to operate in a single propagating mode regime.

12. The waveguide health and wireless charging system of claim 10, wherein the waveguide health and wireless charging system employs a homodyne mixer technique.

13. The waveguide health and wireless charging system of claim 10, wherein the probe RF waveform is at least one of a single frequency, multiple distinct frequencies, a band of frequencies, continuous in time, or a series of pulses.

14. The waveguide health and wireless charging system of claim 10, wherein the transmit antenna and the receive antenna form a transceiver antenna.

15. The waveguide health and wireless charging system of claim 10, wherein the health processing system includes:
a health signal processor, the health signal processor adapted to execute instructions;
an algorithm memory, the algorithm memory adapted to store instructions that, when executed by the health signal processor, cause the health signal processor to undertake the steps of:
comparing the digital representation of the signature RF waveform with the digital representation of the baseline signature RF waveform or the digital representation of the previously stored signature RF waveform; and
generating the warning signal when the step of comparing indicates a difference between the signature RF waveform and the digital representation of the baseline signature RF waveform or the digital representation of the previously stored signature RF waveform; and a waveform memory, the waveform memory adapted to store at least one of the digital representation of the baseline signature RF waveform or the digital representation of the previously stored signature RF waveform.

16. The waveguide health and wireless charging system of claim 10 further comprising one or more reflection elements, each of the one or more reflection elements located within the waveguide, each of the one or more reflection elements adapted to create a corresponding modulation feature in the signature RF waveform.

17. The waveguide health and wireless charging system of claim 10,
  wherein the RF transmitter is located at a first end of the waveguide and the RF receiver is located at a second end of the waveguide opposite the first end of the waveguide or at a location between the first end of the waveguide and the second end of the waveguide; or
  wherein the RF transmitter is located between the first end of the waveguide and the second end of the waveguide and the RF receiver is located at the first end of the waveguide.

18. The waveguide health and wireless charging system of claim 10,
  wherein each of the at least one power RF receivers further includes a power conditioning circuit, the power condition circuit adapted to increase an overall efficiency of the corresponding power RF receivers; and
  wherein the power processing system is adapted to control the power conditioning circuit.

19. The waveguide health and wireless charging system of claim 10,
  wherein each of the at least one power RF receivers further includes a sensor, the sensor adapted to sense a property of a material in the waveguide and to output an indicia of the sensed property of the material in the waveguide;
  wherein each of the at least one power RF receivers is adapted to implement transceiver functionality;
  wherein the power processing system of each of the at least one power RF receivers is adapted to generate a corresponding state-of-health communication based upon the corresponding outputted indicia of the sensed property of the material in the waveguide; and
  wherein the power processing system of each of the at least one power RF receivers is adapted to output the corresponding state-of-health communication using the transceiver functionality.

20. The waveguide health and wireless charging system of claim 10,
  wherein each of the at least one power RF receivers further includes an actuator, the actuator adapted to take local action;
  wherein the power processing system of each of the at least one power RF receivers is adapted to control the corresponding one of the actuators; and
  wherein the power processing system of each of the at least one power RF receivers is adapted to initiate control of the corresponding one of the actuators autonomously or based upon a command carried by the high-power probe RF waveform.

* * * * *